(12) United States Patent
Brenninger et al.

(10) Patent No.: US 6,217,212 B1
(45) Date of Patent: *Apr. 17, 2001

(54) METHOD AND DEVICE FOR DETECTING AN INCORRECT POSITION OF A SEMICONDUCTOR WAFER

(75) Inventors: Georg Brenninger, Oberbergkirchen; Wolfgang Sedlmeier, Obing; Martin Fürfanger, Steinhöring; Per-Ove Hansson, Neuötting, all of (DE)

(73) Assignee: Wacker Siltronic Gesellschaft für Halbleitermaterialien AG, Burghausen (DE)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/181,421

(22) Filed: Oct. 28, 1998

(30) Foreign Application Priority Data

Oct. 30, 1997 (DE) ................................. 197 48 088

(51) Int. Cl.$^7$ ........................ G01N 25/00; B65G 49/07; G01J 5/00
(52) U.S. Cl. ........................ 374/45; 374/161; 374/129; 374/123; 374/133; 374/128; 374/126; 414/936; 414/937
(58) Field of Search ................ 374/45, 161, 130, 374/133, 102, 55, 120, 132, 187, 188, 197, 123, 128, 126, 129; 414/936, 937

(56) References Cited

U.S. PATENT DOCUMENTS

| | | | |
|---|---|---|---|
| 4,636,969 | * 1/1987 | Kyoden et al. | 374/55 |
| 4,697,089 | 9/1987 | Drage | 250/561 |
| 5,102,231 | * 4/1992 | Loewenstein et al. | 374/123 |
| 5,209,569 | * 5/1993 | Fujiwara et al. | 374/55 |
| 5,374,315 | 12/1994 | deBoet et al. | 118/725 |
| 5,645,351 | * 7/1997 | Nakata et al. | 374/161 |
| 5,660,472 | * 8/1997 | Peuse et al. | 374/128 |
| 5,740,062 | * 4/1998 | Berken et al. | 364/478.06 |
| 6,019,506 | * 11/2000 | Senda | 374/55 |
| 6,048,655 | * 4/2000 | Nakahara | 430/22 |
| 6,071,059 | 6/2000 | Mages et al. | 414/411 |
| 6,121,743 | * 9/2000 | Genov et al. | 318/568.11 |
| 6,126,381 | * 10/2000 | Bacchi et al. | 414/754 |
| 6,143,083 | * 11/2000 | Yonemitsu et al. | 118/719 |

FOREIGN PATENT DOCUMENTS 7-169823  7/1995 (JP).

OTHER PUBLICATIONS

Patent Abstracts of Japan Corresponding to JP 7–169823, Apr. 7, 1995.

* cited by examiner

Primary Examiner—G. Bradley Bennett
Assistant Examiner—Gail Verbitsky
(74) Attorney, Agent, or Firm—Collard & Roe, P.C.

(57) ABSTRACT

A method and device for detecting an incorrect position of a semiconductor wafer during a high-temperature treatment of the semiconductor water in a quartz chamber which is heated by IR radiators, has the semiconductor wafer lying on a rotating support and being held at a specific temperature with the aid of a control system. Thermal radiation which is emitted by the semiconductor wafer and the IR radiators is recorded using a pyrometer. The radiation temperature of the recorded thermal radiation is determined. The semiconductor wafer is assumed to be in an incorrect position if the temperature of the recorded thermal radiation fluctuates to such an extent over the course of time that the fluctuation width lies outside a fluctuation range $\Delta T$ which is regarded as permissible.

5 Claims, 2 Drawing Sheets

METHOD AND DEVICE FOR DETECTING AN INCORRECT POSITION OF A SEMICONDUCTOR WAFER

BACKGROUND OF THE INVENTION

1. Field of the Invention

The invention relates to a method for detecting an incorrect position of a semiconductor wafer during a high-temperature treatment of the semiconductor wafer in a quartz chamber which is heated by IR radiators. The semiconductor wafer is lying on a rotating support and is held at a specific temperature with the aid of a control system. The invention also relates to a device for carrying out the method.

2. The Prior Art

A semiconductor wafer is subjected to a high-temperature treatment in a quartz chamber, when it is intended to condition the semiconductor wafer. Examples of conditioning include annealing, rapid thermal annealing and rapid thermal processing (RTP). Other high-temperature treatment includes doping the wafer or depositing a layer of material on one or both sides of the semiconductor wafer (chemical vapor deposition (CVD), atmospheric pressure CVD (ACVD), reduced pressure CVD (RCVD), epitaxy). For this purpose, the semiconductor wafer has to lie on a support. The support is rotated during the treatment to ensure that the semiconductor wafer is treated as uniformly as possible.

One decisive factor in the success of the high-temperature treatment is that the semiconductor wafer lies in the planned position on the support and maintains this position throughout the treatment. Even a slightly incorrect position of the semiconductor wafer in which the semiconductor wafer does not lie parallel to the support may have undesirable consequences. For example, if the semiconductor wafer, during a coating treatment, does not lie parallel to the support, but rather is tilted slightly out of the parallel position on the support, the thickness of the layer deposited may not be uniform. Crystal defects within the semiconductor wafer may occur.

Often, the support for the semiconductor wafer is raised in the edge region. The intention is to avoid incorrect positions and to allow the semiconductor wafer to be centered. Despite such precautionary measures, it is still possible that the semiconductor wafer may lie in an undesired position on the support. Semiconductor wafers which are faulty for this reason have to be identified and separated out following the treatment. This procedure is complex and uneconomical.

SUMMARY OF THE INVENTION

The present invention makes it possible to prevent these problems. The invention provides a way of recognizing that the semiconductor wafer is in an incorrect position even during the treatment of a semiconductor wafer.

The invention relates to a method for detecting an incorrect position of a semiconductor wafer during a high-temperature treatment of the semiconductor wafer in a quartz chamber which is heated by IR radiators, the semiconductor wafer lying on a rotating support and being held at a specific temperature with the aid of a control system, comprising a) recording thermal radiation which is emitted by the semiconductor wafer and the IR radiators using a pyrometer;

b) determining the radiation temperature of the recorded thermal radiation; and c) determining the semiconductor wafer to be in an incorrect position if the radiation temperature of the recorded thermal radiation fluctuates to such an extent over time that the fluctuation has a width that lies outside a permissible temperature fluctuation range $\Delta T$.

The invention also relates to a device for carrying out the method, in which this device will detect an incorrect position of a semiconductor wafer during a high-temperature treatment of the semiconductor wafer in a quartz chamber which is heated by IR radiators. The semiconductor wafer is lying on a rotating support and is held at a specific temperature by means of a control system. The device has a pyrometer which records thermal radiation emitted by the semiconductor wafer and the IR radiators. The pyrometer is connected to a unit which determines the radiation temperature of the recorded thermal radiation. This unit generates a signal if the radiation temperature of the recorded thermal radiation fluctuates to such an extent over the course of time that the fluctuation amplitude lies outside a permissible temperature fluctuation range $\Delta T$.

By using the invention, there is no need for an involved search for semiconductor wafers which are faulty as a result of being incorrectly positioned during a high-temperature treatment. Such semiconductor wafers are identified as early as at the start of or during the high-temperature treatment and are separated out, for example following the high-temperature treatment. However, it is preferred to interrupt the high-temperature treatment after it has been established that the semiconductor wafer is in an incorrect position. The semiconductor wafer is then moved into the desired position and the high-temperature treatment is continued. This is advantageous in those cases in which, at the time an incorrect position is established, the semiconductor wafer has not yet undergone any material change, for example a coating.

An incorrect position of the semiconductor wafer is regarded as a position which deviates to an impermissible extent from a horizontal position of the semiconductor wafer. An incorrect position is established by measuring thermal radiation with the aid of a pyrometer which is sensitive to this radiation. The pyrometer records thermal radiation which is emitted by the semiconductor wafer. This thermal radiation has radiation components which emanate from the IR radiators and are reflected by the semiconductor wafer. Under stationary conditions, the intensity of the radiation components reflected and recorded by the pyrometer depends on the corresponding angle of reflection. If the semiconductor wafer is in an incorrect position, the intensity of the thermal radiation recorded by the pyrometer fluctuates significantly. This is because the angle of reflection varies during each revolution of the support. The oscillations of the thermal radiation are correlated with the frequency of the wafer rotation.

By contrast, if the semiconductor wafer is in the planned horizontal position during the high-temperature treatment, this has practically no effect on the angle of reflection and there are no fluctuations in intensity. The radiation intensity recorded by the pyrometer is proportional to a radiation temperature. The semiconductor wafer is assumed to be in an incorrect position if the radiation intensity or the radiation temperature derived therefrom fluctuates in the following manner. There is temperature fluctuation to such an extent over the course of time that the temperature fluctuation amplitude lies outside a temperature fluctuation range $\Delta T$ which is regarded as permissible. The fluctuation range which is regarded as permissible can be determined by routine experimentation. It preferably corresponds to a natural fluctuation range which is established when the semiconductor wafer is lying in the horizontal position on the support in the correct position.

BRIEF DESCRIPTION OF THE DRAWINGS

Other objects and features of the present invention will become apparent from the following detailed description considered in connection with the accompanying drawings which disclose several embodiments of the present invention. It should be understood, however, that the drawings are designed for the purpose of illustration only and not as a definition of the limits of the invention.

In the drawings, wherein similar reference characters denote similar elements throughout the several views.

DETAILED DESCRIPTION OF PREFERRED EMBODIMENTS

Figure 1:
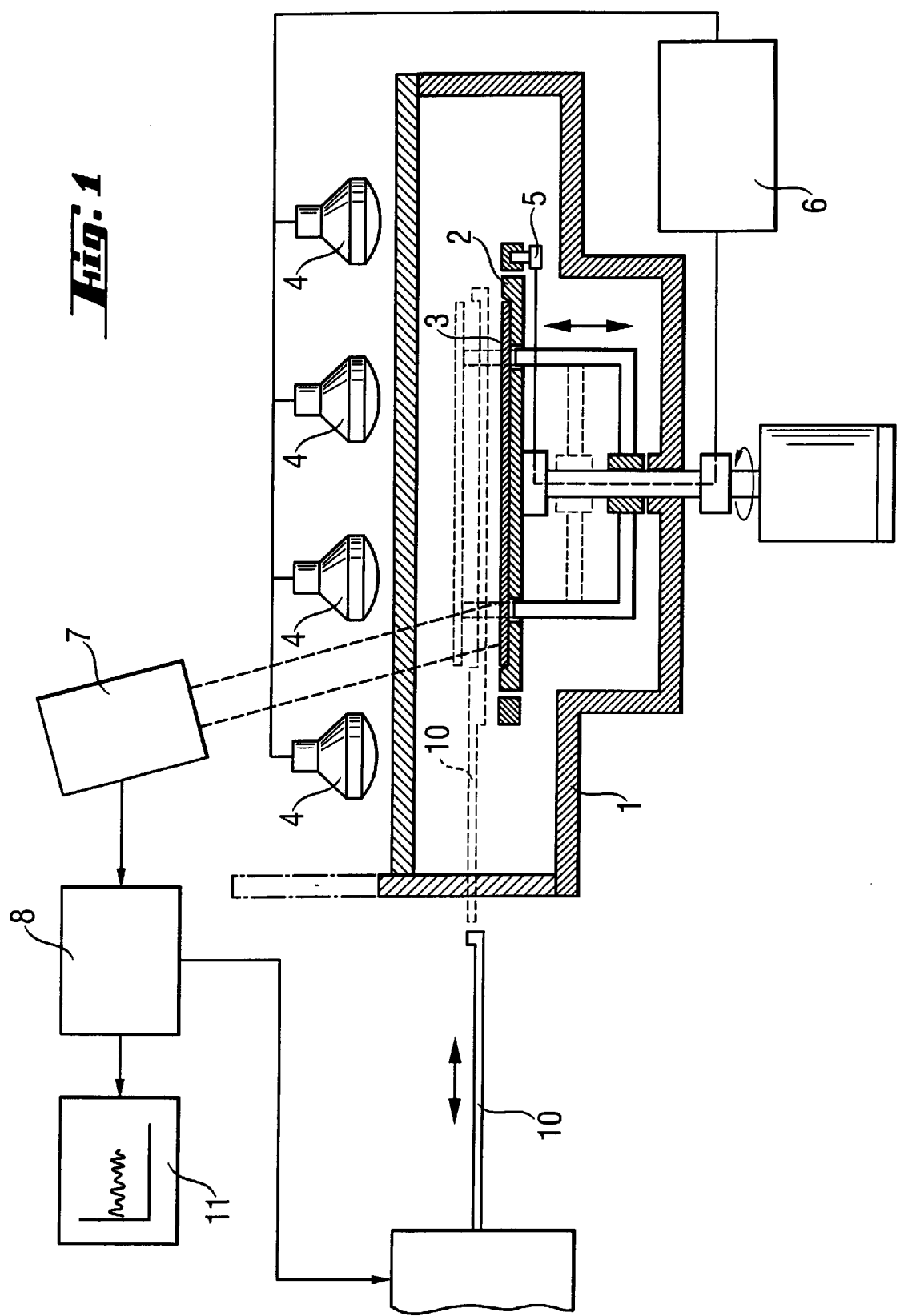
FIG. 1 diagrammatically illustrates an embodiment of a device according to the invention.

Turning now in detail to the drawings, the device of FIG. 1 comprises a chamber 1 which can be closed off in a gas tight manner and is made from quartz material, referred to below as the quartz chamber. Inside the quartz chamber is a support 2 on which a semiconductor wafer 3 is laid. The semiconductor wafer lies in a horizontal position on support 2 which rotates about a central axis. A position which deviates from this situation is regarded as an incorrect position.

As an alternative embodiment, the support may also be designed in such a way that both sides of the semiconductor wafer are freely accessible for the purpose, for example, of coating both sides. Thus, semiconductor wafer 3 is supported only in the edge region of the support. Support 2 is preferably made of a material which does not contaminate the semiconductor wafer and is not attacked under the conditions of a high-temperature treatment. A graphite support coated with silicon carbide is particularly suitable.

One or more IR radiators 4 are arranged outside quartz chamber 1. IR radiators 4, for example halogen lamps, supply the requisite radiation energy to heat semiconductor wafer 3 to a desired process temperature. This desired temperature preferably lies in the range from 600° C. to 1300°C. Semiconductor wafer 3 is held at a specific temperature with the aid of a control device. The control device comprises a temperature sensor, for example a thermocouple 5. Thermocouple 5 measures the temperature of semiconductor wafer support 2. A master computer 6 compares the measured temperature with a stored desired temperature. If appropriate this computer changes the output from IR radiators 4. The temperature of semiconductor wafer 3 may also be measured by pyrometry.

A pyrometer 7 is arranged outside quartz chamber 1. Pyrometer 7 records thermal radiation which is emitted by semiconductor wafer 3. This radiation has radiation components which are reflected by the surface of semiconductor wafer 3 and emanate from IR radiators 4. Pyrometer 7 is connected to a signal processing device 8 which evaluates the recorded thermal radiation and assigns to it a radiation temperature. Pyrometer 7 preferably records thermal radiation having a wavelength in the range from 0.7 to 1.1 $\mu$m.

The temperature of semiconductor wafer 3 is adjusted to a specific value and pyrometer 7 records thermal radiation which corresponds to a specific radiation temperature. The signal processing device 8 generates a signal if the radiation temperature has a fluctuation amplitude which is greater than a permissible fluctuation range $\Delta T$. This is the case if semiconductor wafer 3 is in an incorrect position. The signal is able to activate a manipulator 10 which then enters quartz chamber 1, picks up semiconductor wafer 3, moves it to a correct position and places semiconductor wafer 3 back on support 2.

Figure 2:
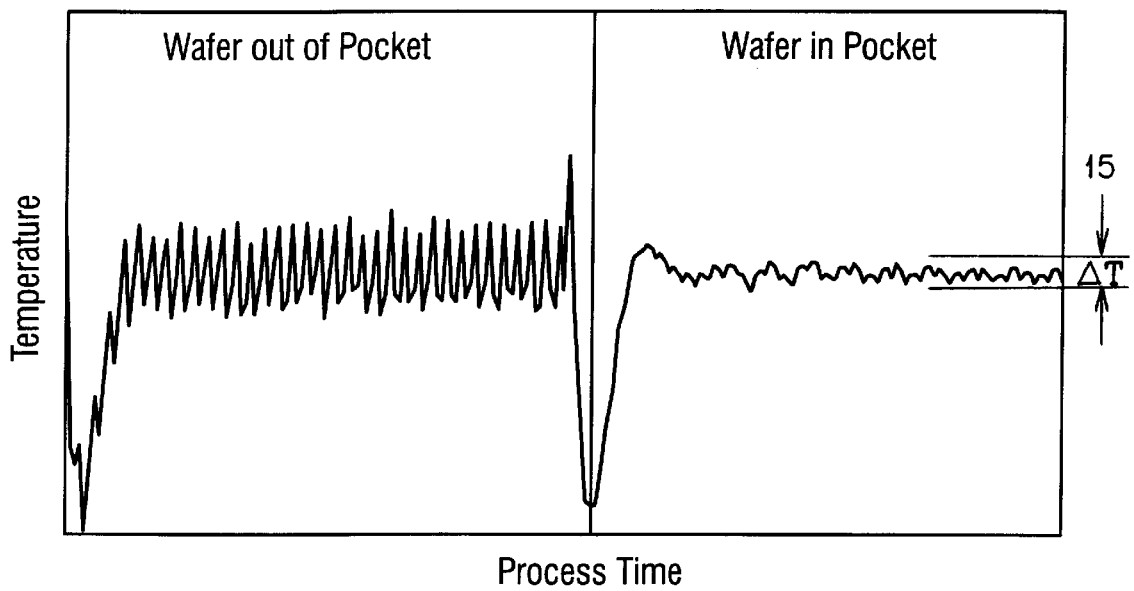
FIG. 2 shows in a graph that temperature fluctuations as a function of time depend on whether the semiconductor wafer is in an incorrect position or is placed in a correct position on the support.

In a further embodiment, the signal processing device 8 is connected to a recording instrument 11 on which the measured temperatures are displayed as a function of time. This can be seen from the graph print out as shown in FIG. 2. This graph shows different amounts of temperature fluctuations over time. These differences are recorded and depend on whether semiconductor wafer 3 is in an incorrect position on support 2 (wafer out of pocket) or semiconductor wafer 3 is lying on support 2 in a correct position (wafer in pocket). FIG. 2 shows the permissible temperature fluctuation range $\Delta T$ 15.

While a few embodiments of the present invention have been shown and described, it is to be understood that many changes and modifications may be made thereunto without departing from the spirit and scope of the invention as defined in the appended claims.

What is claimed is:

1. A method for detecting an incorrect position of a semiconductor wafer during a high-temperature treatment of the semiconductor wafer in a quartz chamber which is heated by IR radiators, the semiconductor wafer lying on a rotating support comprising measuring the temperature of the semiconductor wafer and controlling the temperature of the semiconductor wafer as to hold the semiconductor wafer at a specific temperature;

recording thermal radiation which is emitted by the semiconductor wafer using a pyrometer, said thermal radiation having components which emanate from the IR radiators and are reflected by the semiconductor wafer;

determining a radiation temperature of the recorded thermal radiation; and estimating the wafer lying in an incorrect position if said radiation temperature of said recorded thermal radiation fluctuates to such an extent over time that the fluctuation has an amplitude which lies outside a temperature fluctuation range $\Delta T$ which is considered as being permissible.

2. The method as claimed in claim 1, wherein the step of recording said thermal radiation recorded by the pyrometer records wavelengths in the range from 0.7 to 1.1 $\mu$m.

3. The method as claimed in claim 1, wherein the permissible fluctuation range $\Delta T$ corresponds to a natural fluctuation range which is established when the semiconductor wafer is lying in a correct position on the support.

4. A method for detecting an incorrect position of a semiconductor wafer during a high-temperature treatment of the semiconductor wafer in a quartz chamber which is heated by IR radiators, the semiconductor wafer lying on a rotating support and being held at a specific temperature with the aid of a control system, comprising:

(a) recording thermal radiation which is emitted by the semiconductor wafer and the IR radiators using a pyrometer;

(b) determining a radiation temperature of the recorded thermal radiation; and (c) determining the semiconductor wafer to be in an incorrect position if said radiation temperature of said recorded thermal radiation fluctuates to such an extent over time that the fluctuation has an amplitude which lies outside a permissible temperature fluctuation range $\Delta T$;

interrupting the high-temperature treatment if the semiconductor wafer is in an incorrect position;

moving the semiconductor wafer into a correct position on the support; and continuing the high-temperature treatment of the wafer.

5. A device for detecting an incorrect position of a semiconductor wafer during a high-temperature treatment of the semiconductor wafer, comprising a quartz chamber having a rotating support, and said semiconductor wafer lying on said rotating support;

IR radiators for heating said quartz chamber;

a control system for maintaining a specific temperature in said quartz chamber;

a pyrometer for recording thermal radiation emitted by the semiconductor wafer and the IR radiators, said pyrometer being connected to said control system for determining the radiation temperature of the recorded thermal radiation; and said control system generating a signal if the radiation temperature of the recorded thermal radiation fluctuates to such an extent over time that a fluctuation amplitude lies outside a permissible fluctuation range $\Delta T$; and a manipulator which is activated by the signal and which enters said quartz chamber, picks up the semiconductor wafer and puts the wafer back onto said support in such a way that the wafer has a correct position.

* * * * *